United States Patent
Hsu et al.

(10) Patent No.: US 11,282,759 B2
(45) Date of Patent: Mar. 22, 2022

(54) CHIP PACKAGE STRUCTURE HAVING WARPAGE CONTROL AND METHOD OF FORMING THE SAME

(71) Applicant: Taiwan Semiconductor Manufacturing Co., Ltd., Hsinchu (TW)

(72) Inventors: Feng-Cheng Hsu, New Taipei (TW); Shin-Puu Jeng, Hsinchu (TW); Shuo-Mao Chen, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 2 days.

(21) Appl. No.: 16/816,455

(22) Filed: Mar. 12, 2020

(65) Prior Publication Data

US 2021/0074602 A1   Mar. 11, 2021

Related U.S. Application Data

(60) Provisional application No. 62/897,459, filed on Sep. 9, 2019.

(51) Int. Cl.
*H01L 21/56* (2006.01)
*H01L 23/31* (2006.01)
(Continued)

(52) U.S. Cl.
CPC ........ *H01L 23/3107* (2013.01); *H01L 21/561* (2013.01); *H01L 21/565* (2013.01);
(Continued)

(58) Field of Classification Search
CPC ............ H01L 23/3107; H01L 23/3157; H01L 23/562; H01L 21/561; H01L 21/565;
(Continued)

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |

(Continued)

FOREIGN PATENT DOCUMENTS

| | | |
|---|---|---|
| TW | 201703221 A | 1/2017 |
| TW | 201822311 A | 6/2018 |
| TW | 201903996 A | 1/2019 |

OTHER PUBLICATIONS

Chinese language office action dated Nov. 12 2020, issued in application No. TW 109122849.

*Primary Examiner* — Timor Karimy
(74) *Attorney, Agent, or Firm* — McClure, Qualey & Rodack, LLP (57) ABSTRACT

A package structure and a method of forming the same are provided. The package structure includes a package substrate, an interposer substrate, a first semiconductor device, a second semiconductor device, and a protective layer. The interposer substrate is disposed over the package substrate. The first semiconductor device and the second semiconductor device are disposed over the interposer substrate, wherein the first semiconductor device and the second semiconductor device are different types of electronic devices. The protective layer is formed over the interposer substrate to surround the first semiconductor device and the second semiconductor device. The second semiconductor device is exposed from the protective layer and the first semiconductor device is not exposed from the protective layer.

20 Claims, 11 Drawing Sheets

(51) Int. Cl.
*H01L 23/00* (2006.01)
*H01L 25/065* (2006.01)
*H01L 25/10* (2006.01)

(52) U.S. Cl.
CPC ........ *H01L 21/568* (2013.01); *H01L 23/3157* (2013.01); *H01L 23/562* (2013.01); *H01L 24/16* (2013.01); *H01L 24/32* (2013.01); *H01L 24/73* (2013.01); *H01L 25/0657* (2013.01); *H01L 25/105* (2013.01); *H01L 2224/16225* (2013.01); *H01L 2224/32225* (2013.01); *H01L 2224/73204* (2013.01); *H01L 2924/15321* (2013.01); *H01L 2924/3511* (2013.01)

(58) Field of Classification Search
CPC ....... H01L 21/568; H01L 24/16; H01L 24/32; H01L 24/73; H01L 25/0657; H01L 25/105; H01L 2224/16225; H01L 2224/32225; H01L 2224/73204; H01L 2924/15321; H01L 2924/3511
See application file for complete search history.

(56) References Cited

U.S. PATENT DOCUMENTS

| | | | |
|---|---|---|---|
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 10,163,750 | B2 | 12/2018 | Yu et al. |
| 10,319,699 | B2 | 6/2019 | Wei et al. |
| 10,707,177 | B2 | 7/2020 | Huang et al. |
| 2013/0241044 | A1* | 9/2013 | Kim ................. H01L 23/49816 257/698 |
| 2018/0053741 | A1 | 2/2018 | Chang et al. |
| 2018/0138101 | A1* | 5/2018 | Yu ......................... H01L 21/563 |

* cited by examiner

CHIP PACKAGE STRUCTURE HAVING WARPAGE CONTROL AND METHOD OF FORMING THE SAME

PRIORITY CLAIM AND CROSS-REFERENCE

This Application claims the benefit of U.S. Provisional Application No. 62/897,459, filed on Sep. 9, 2019, the entirety of which is incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which utilize less area or are lower in height, have been developed to package the semiconductor devices.

Although existing packaging techniques have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to 3D packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1A:
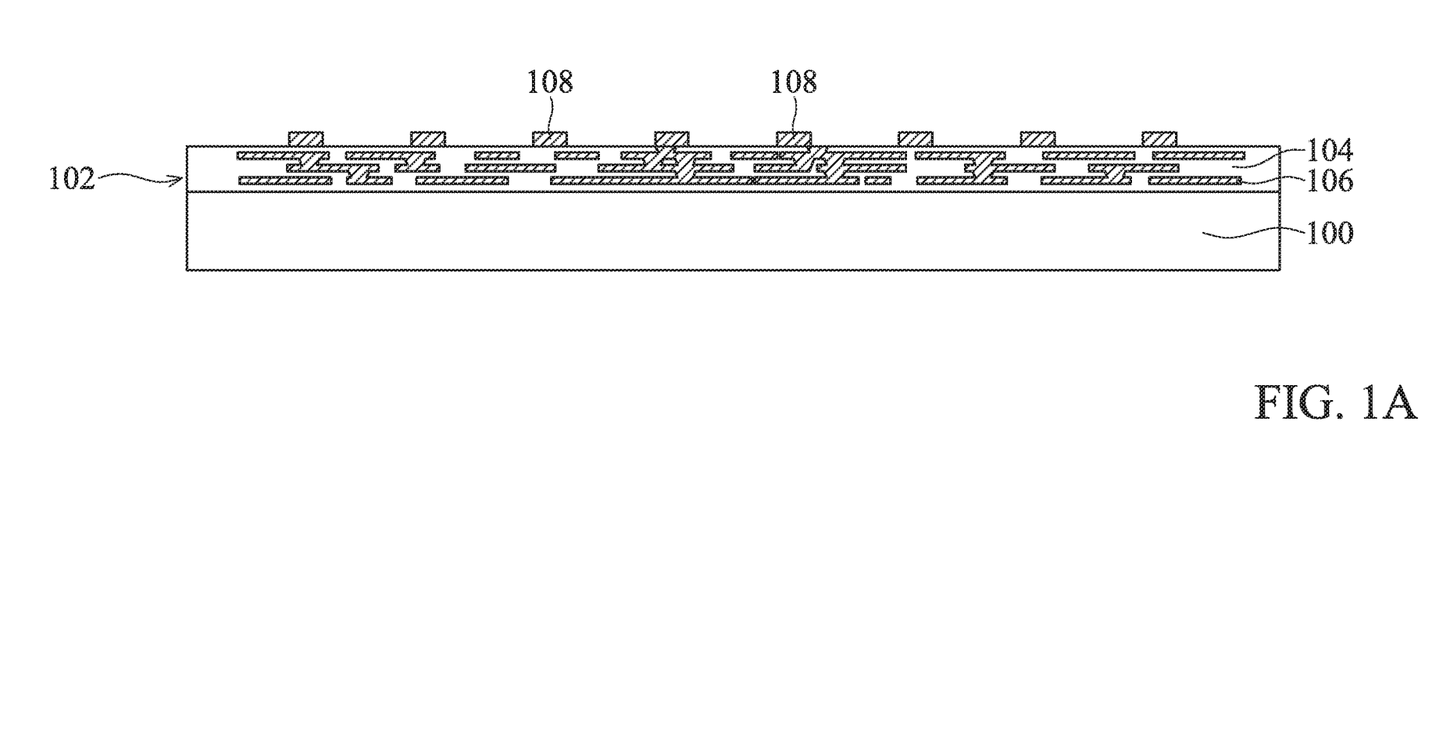
FIGS. 1A-1E are cross-sectional views of various stages of a process for forming a package structure, in accordance with some embodiments.

FIGS. 1A-1E are cross-sectional views of various stages of a process for forming a package structure, in accordance with some embodiments. As shown in FIG. 1A, a package substrate 102 is formed over a carrier substrate 100, in accordance with some embodiments. The carrier substrate 100 may be a glass substrate, semiconductor substrate, or another suitable substrate. The package substrate 102 may be used to provide electrical connection between the semiconductor devices (which will be described later) in the package structure and an external electronic device, after the carrier substrate 100 is removed at a subsequent stage illustrated in FIG. 1E.

The package substrate 102 may be used for routing. In some embodiments, the package substrate 102 is a redistribution substrate. In some alternative embodiments, the package substrate 102 is a build-up substrate including a core and build-up layers on opposing sides of the core. In the subsequent discussion of the embodiments of the present disclosure, a redistribution substrate is illustrated as an example of the package substrate 102, while the teaching revealed in accordance with the example embodiments are readily applicable for build-up substrates. The redistribution substrate 102 includes multiple laminated insulating layers 104 and multiple conductive features 106 surrounded by the insulating layers 104, as shown in FIG. 1A. The conductive features 106 may include conductive lines, conductive vias, and/or conductive pads. In some embodiments, some of the conductive vias are stacked with each other. The upper conductive via is substantially aligned with the lower conductive via. In some embodiments, some of the conductive vias are staggered vias. The upper conductive via is misaligned with the lower conductive via.

The insulating layers 104 may be made of or include one or more polymer materials. The polymer material(s) may include polybenzoxazole (PBO), polyimide (PI), epoxy-based resin, one or more other suitable polymer materials, or a combination thereof. In some embodiments, the polymer material is photosensitive. A photolithography process may therefore be used to form openings with desired patterns in the insulating layers 104.

In some other embodiments, some or all of the insulating layers 104 are made of or include dielectric materials other than polymer materials. The dielectric material may include silicon oxide, silicon carbide, silicon nitride, silicon oxynitride, one or more other suitable materials, or a combination thereof.

The conductive features 106 may include conductive lines providing electrical connection in horizontal directions and conductive vias providing electrical connection in vertical directions. The conductive features 106 may be made of or include copper, aluminum, gold, cobalt, titanium, nickel, silver, graphene, one or more other suitable conductive materials, or a combination thereof. In some embodiments, the conductive features 106 include multiple sub-layers. For example, each of the conductive features 106 contains multiple sub-layers including Ti/Cu, Ti/Ni/Cu, Ti/Cu/Ti, Al/Ti/Ni/Ag, other suitable sub-layers, or a combination thereof.

The formation of the redistribution substrate 102 may involve multiple deposition or coating processes, multiple patterning processes, and/or multiple planarization processes.

The deposition or coating processes may be used to form insulating layers and/or conductive layers. The deposition or coating processes may include a spin coating process, an electroplating process, an electroless process, a chemical vapor deposition (CVD) process, a physical vapor deposition (PVD) process, an atomic layer deposition (ALD) process, one or more other applicable processes, or a combination thereof.

The patterning processes may be used to pattern the formed insulating layers and/or the formed conductive layers. The patterning processes may include a photolithography process, an energy beam drilling process (such as a laser beam drilling process, an ion beam drilling process, or an electron beam drilling process), an etching process, a mechanical drilling process, one or more other applicable processes, or a combination thereof.

The planarization processes may be used to provide the formed insulating layers and/or the formed conductive layers with planar top surfaces to facilitate subsequent processes. The planarization processes may include a mechanical grinding process, a chemical mechanical polishing (CMP) process, one or more other applicable processes, or a combination thereof.

As shown in FIG. 1A, the redistribution substrate 102 also includes conductive elements 108 formed thereon, in accordance with some embodiments. Each conductive element 108 may be exposed at or protruding from the topmost surface of the insulating layers 104, and may be electrically connected to one of the conductive features 106. The conductive elements 108 may be used to hold or receive conductive features such as conductive pillars and/or conductive balls.

The conductive elements 108 may be made of or include copper, aluminum, gold, cobalt, titanium, tin, one or more other suitable materials, or a combination thereof. The conductive elements 108 may be formed using an electroplating process, an electroless plating process, a placement process, a printing process, a physical vapor deposition (PVD) process, a chemical vapor deposition (CVD) process, one or more other applicable processes, or a combination thereof.

Figure 1B:
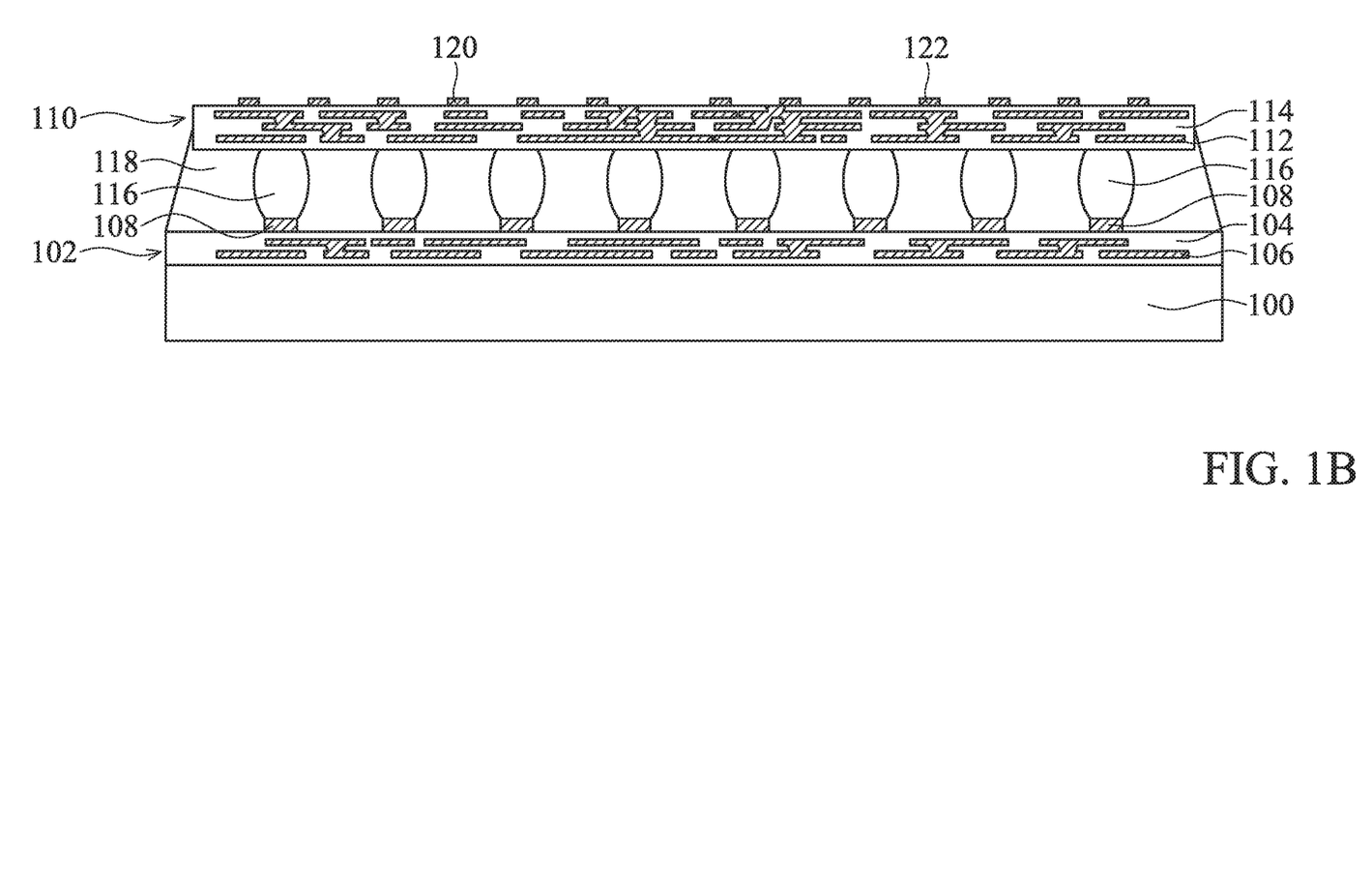

As shown in FIG. 1B, an interposer substrate 110 is stacked over the redistribution substrate 102, in accordance with some embodiments. In some embodiments, the interposer substrate 110 is bonded onto the conductive elements 108 through conductive structures 116. The conductive structures 116 may include solder bumps, solder balls, conductive pillars, other suitable conductive elements, or a combination thereof.

In some embodiments, the interposer substrate 110 includes a board 112 and conductive features 114. The conductive features 114 may be made of or include copper, aluminum, cobalt, nickel, gold, silver, tungsten, one or more other suitable materials, or a combination thereof. The board 112 may be made of or include a polymer material, a ceramic material, a metal material, a semiconductor material, one or more other suitable materials, or a combination thereof. For example, the board 112 includes resin, prepreg, glass, and/or ceramic. In cases where the board 112 is made of a metal material or a semiconductor material (such as silicon), dielectric layers may be formed between the board 112 and the conductive features 114 to prevent short circuiting.

In cases where the board 112 is made of or includes a polymer material, the board 112 may further include fillers that are dispersed in the polymer material. The polymer material may be made of or include epoxy-based resin, polyimide-based resin, one or more other suitable polymer materials, or a combination thereof. The examples of the fillers may include fibers (such as silica fibers and/or carbon-containing fibers), particles (such as silica particles and/or carbon-containing particles), or a combination thereof.

In some embodiments, the interposer substrate 110 contains more filler than the redistribution substrate 102. In some embodiments, the board 112 has a greater weight percentage of fillers than that of the insulating layers 104 of the redistribution substrate 102. In some embodiments, the insulating layers 104 of the redistribution substrate 102 are made of or include a polymer material. In some embodiments, the insulating layers 104 of the redistribution substrate 102 contain no filler. In these cases, the redistribution substrate 102 contains no filler.

In some embodiments, the interposer substrate 110 and the carrier substrate 100 are pressed against each other at an elevated temperature. As a result, the interposer substrate 110 is bonded to the redistribution substrate 102 through the conductive structures 116. In some embodiments, a thermal compression process is used to achieve the bonding process mentioned above.

Afterwards, an underfill element 118 is formed to surround and protect the conductive structures 116, as shown in FIG. 1B in accordance with some embodiments. The underfill element 118 may be made of or include an insulating material such as an underfill material. The underfill material may include an epoxy, a resin, a filler material, a stress release agent (SRA), an adhesion promoter, another suitable material, or a combination thereof. In some embodiments, an underfill material in liquid state is dispensed into a gap between the interposer substrate 110 and the redistribution substrate 102 to reinforce the strength of the conductive structures 116 and therefore the overall package structure. After the dispensing, the underfill material is cured to form the underfill element 118. The underfill element 118 may also provide a thermal conduction path for the package structure. In some other embodiments, the underfill element 118 is not formed.

As shown in FIG. 1B, the interposer substrate 110 also includes conductive elements 120 and 122 formed thereon, in accordance with some embodiments. Each of the conductive elements 120 and 122 may be exposed at or protruding from the top surface of the board 112, and may be electrically connected to one of the conductive features 114. The conductive elements 120 and conductive elements 122 may be used to hold or receive conductive features such as conductive pillars and/or conductive balls. The materials and formation method of the conductive elements 120 and conductive elements 122 may be the same or similar to those of the conductive elements 108 illustrated in FIG. 1A.

Figure 1C:
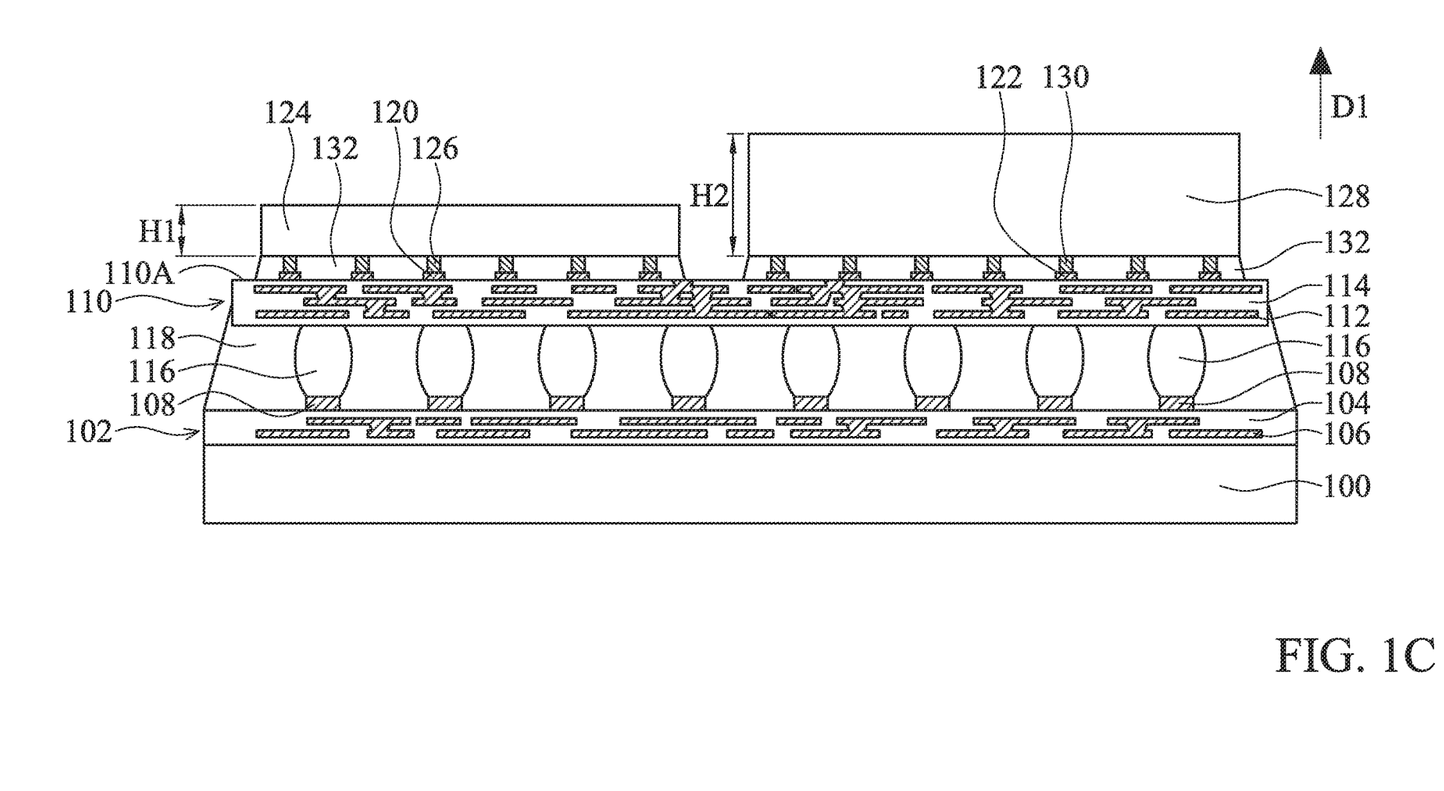

As shown in FIG. 1C, semiconductor devices 124 and semiconductor devices 128 are stacked over the interposer substrate 110, in accordance with some embodiments (for simplicity, only one semiconductor device 124 and one semiconductor device 128 are shown). In some embodiments, the semiconductor devices 124 and/or semiconductor devices 128 include one or more semiconductor dies or chips that could be any type of integrated circuit, such as a processor, logic circuitry, memory, analog circuit, digital circuit, mixed signal, and the like. In some embodiments, the semiconductor devices 124 and/or semiconductor devices 128 include one or more active devices such as transistors, diodes, photodiodes, or other suitable active devices. Alternatively, the semiconductor devices 124 and/or semiconductor devices 128 include one or more passive device such as resistors, capacitors, inductors, or other suitable passive devices.

In some embodiments, the semiconductor devices 124 and semiconductor devices 128 are different types of electronic devices that provide different functions. For example, the semiconductor devices 124 are memory devices, and the semiconductor devices 128 are processor devices. However, other combinations of the semiconductor devices 124 and semiconductor devices 128 can also be used.

In some embodiments, the semiconductor devices 124 and semiconductor devices 128 are of different sizes. For example, the height H1 of the semiconductor device 124 in a direction D1 substantially perpendicular to the upper surface 110A of the interposer substrate 110 is smaller than the height H2 of the semiconductor device 128 in the direction D1, as shown in FIG. 1C.

In some embodiments, each semiconductor device 124 is bonded onto the conductive elements 120 through conductive structures 126, and each semiconductor device 128 is bonded onto the conductive elements 122 through conductive structures 130. As such, various semiconductor devices 124 and 128 may communicate with each other through the interposer substrate 110. The signal transmission speed is therefore improved. The conductive structures 126 and/or conductive structures 130 may include conductive pillars, solder bumps, solder balls, one or more other suitable conductive elements, or a combination thereof. The materials and formation method of the conductive structures 126 and conductive structures 130 may be the same or similar to those of the conductive structures 116 illustrated in FIG. 1B. In some embodiments, an underfill element 132 is formed to surround and protect the conductive structures 126 and conductive structures 130. The materials and formation method of the underfill element 132 may be the same or similar to those of the underfill element 118 illustrated in FIG. 1B.

In some unillustrated embodiments, the conductive elements 120 and/or conductive elements 122 are omitted, and the semiconductor devices 124 and/or semiconductor devices 128 are bonded onto the pad regions (constructed by some of the conductive features 114) of the interposer substrate 110 through solder bumps, solder balls, conductive pillars, one or more other suitable conductive elements, or a combination thereof.

Figure 1D:
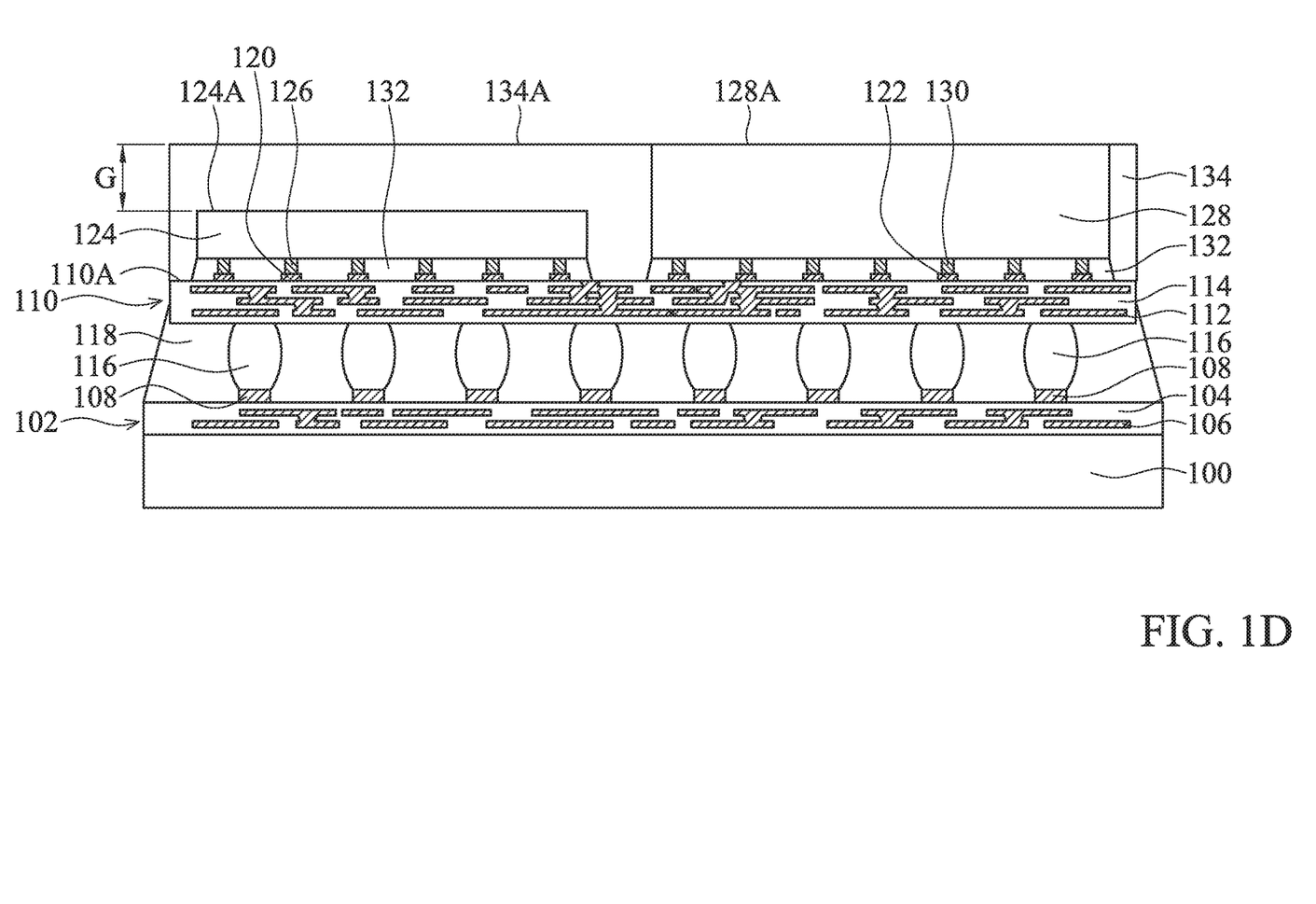

As shown in FIG. 1D, a protective layer 134 is formed to surround and protect the semiconductor devices 124 and semiconductor devices 128, in accordance with some embodiments. In some embodiments, the protective layer 134 is separated from the conductive structures 126 below the semiconductor device 124 and the conductive structures 130 below the semiconductor device 128 by the underfill element 132. However, embodiments of the disclosure are not limited thereto. Many variations and/or modifications can be made to embodiments of the disclosure. In some other embodiments, the underfill element 132 is not formed. In these cases, the protective layer 134 may be in direct contact with the conductive structures 126 below the semiconductor device 124 and the conductive structures 130 below the semiconductor device 128.

In some embodiments, the protective layer 134 is made of or includes an insulating material such as a molding material. The molding material may include a polymer material, such as an epoxy-based resin with fillers dispersed therein. In some embodiments, a molding material (such as a liquid molding material) is dispensed onto the upper surface 110A of the interposer substrate 110 and/or over the semiconductor devices 124 and semiconductor devices 128. In some embodiments, a thermal process is then used to cure the liquid molding material and to transform it into the protective layer 134.

In some embodiments, a planarization process is applied on the protective layer 134 to partially remove the protective layer 134. As a result, the top surface 128A of each semiconductor device 128 is exposed while the top surface 124A of each semiconductor device 124 is not exposed, as shown in FIG. 1D. In some embodiments, after the planarization process, the top surface 128A of each semiconductor device 128 is substantially flush with the top surface 134A of the protective layer 134, and the top surface 124A of each semiconductor devices 124 is separated from the top surface 134A of the protective layer 134 by a distance G. The planarization process may include a grinding process, a chemical mechanical polishing (CMP) process, an etching process, a dry polishing process, one or more other applicable processes, or a combination thereof.

Figure 1E:
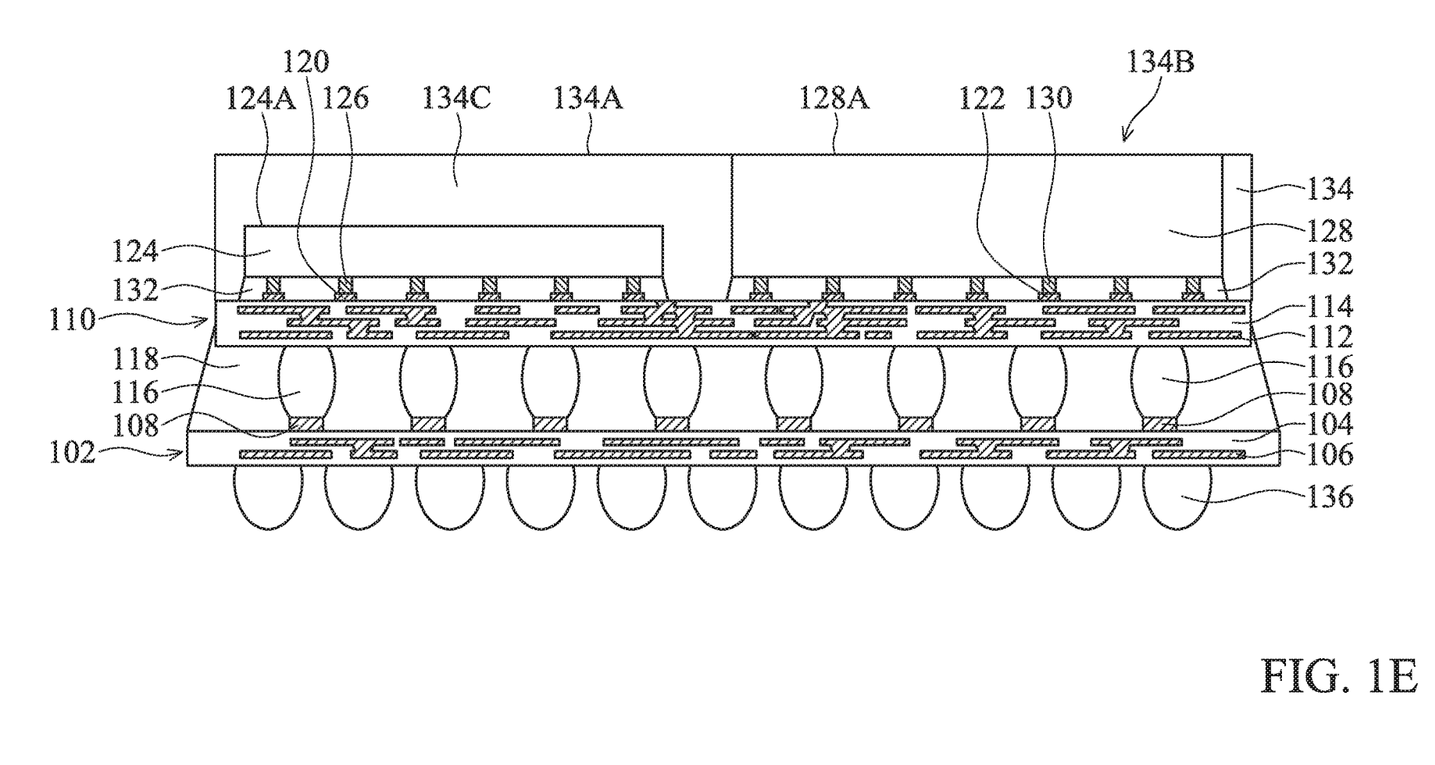

Afterwards, the carrier substrate 100 is removed to expose a surface of the package substrate 102, as shown in FIG. 1E in accordance with some embodiments. In some embodiments, a release film (not shown) is previously formed over the carrier substrate 100 before the formation of the package substrate 102. The release film is a temporary bonding material, which facilitates the separation operation between the carrier substrate 100 and the package substrate 102.

In some embodiments, conductive bumps 136 are then formed over the surface of the package substrate 102 that is originally covered by the carrier substrate, as shown in FIG. 1E. Each conductive bump 136 may be electrically connected to one of the conductive features 106 of the package substrate 102. The conductive bumps 136 enable electrical connection between the package structure and an external device (not shown). The conductive bumps 136 may be or include solder bumps such as tin-containing solder bumps. The tin-containing solder bumps may further include copper, silver, gold, aluminum, lead, one or more other suitable materials, or a combination thereof. In some embodiments, the tin-containing solder bump is lead-free.

In some embodiments, solder balls (or solder elements) are disposed on the exposed conductive features 106 after the removal of the carrier substrate 100. A reflow process is then carried out to melt the solder balls into the conductive bumps 136. In some other embodiments, under bump metallization (UBM) elements are formed over the exposed conductive features 106 before the solder balls are disposed. In some other embodiments, solder elements are electroplated onto the exposed conductive features 106. Afterwards, a reflow process is used to melt the solder element to form the conductive bumps 136.

In some embodiments, a singulation process is then carried out. As a result, multiple separate package structures are formed. In FIG. 1E, one of the package structures is shown. The protective layer 134 has an opening 134B that exposes the top surface 128A of each semiconductor device 128. In cases where a large amount of heat may be generated from the semiconductor device 128 (such as a processor device) in operation, the opening 134B in the protective layer 134 facilitates rapid heat dissipation from the semiconductor device 128 and avoids overheating.

Additionally, the protective layer 134 further has a cover portion 134C covering the top surface 124A of each semiconductor device 124, as shown in FIG. 1E. In some embodiments, the cover portion 134C covers substantially the entire top surface 124A of the semiconductor device 124. In some embodiments, the cover portion 134C is disposed directly on the top surface 124A of the semiconductor device 124. Thus, the cover portion 134C of the protective layer 134 may reduce warpage in the semiconductor device 124, which will be explained below. In some embodiments, the semiconductor device 124 is prone to warping or bend caused by the elevated temperatures used in the reflow processes or thermal processes discussed above, and the warpage in the semiconductor device 124 may cause irregular joints and/or cracks in the underlying conductive structures 126. Being covered and pressed by the cover portion 134C, the warpage in the semiconductor device 124 can be reduced.

As a result, the performance and the reliability of the semiconductor devices in the package structure are improved. Consequently, the overall performance (including the electrical and mechanical performance) and the reliability of the package structure are also improved.

Figure 2A:
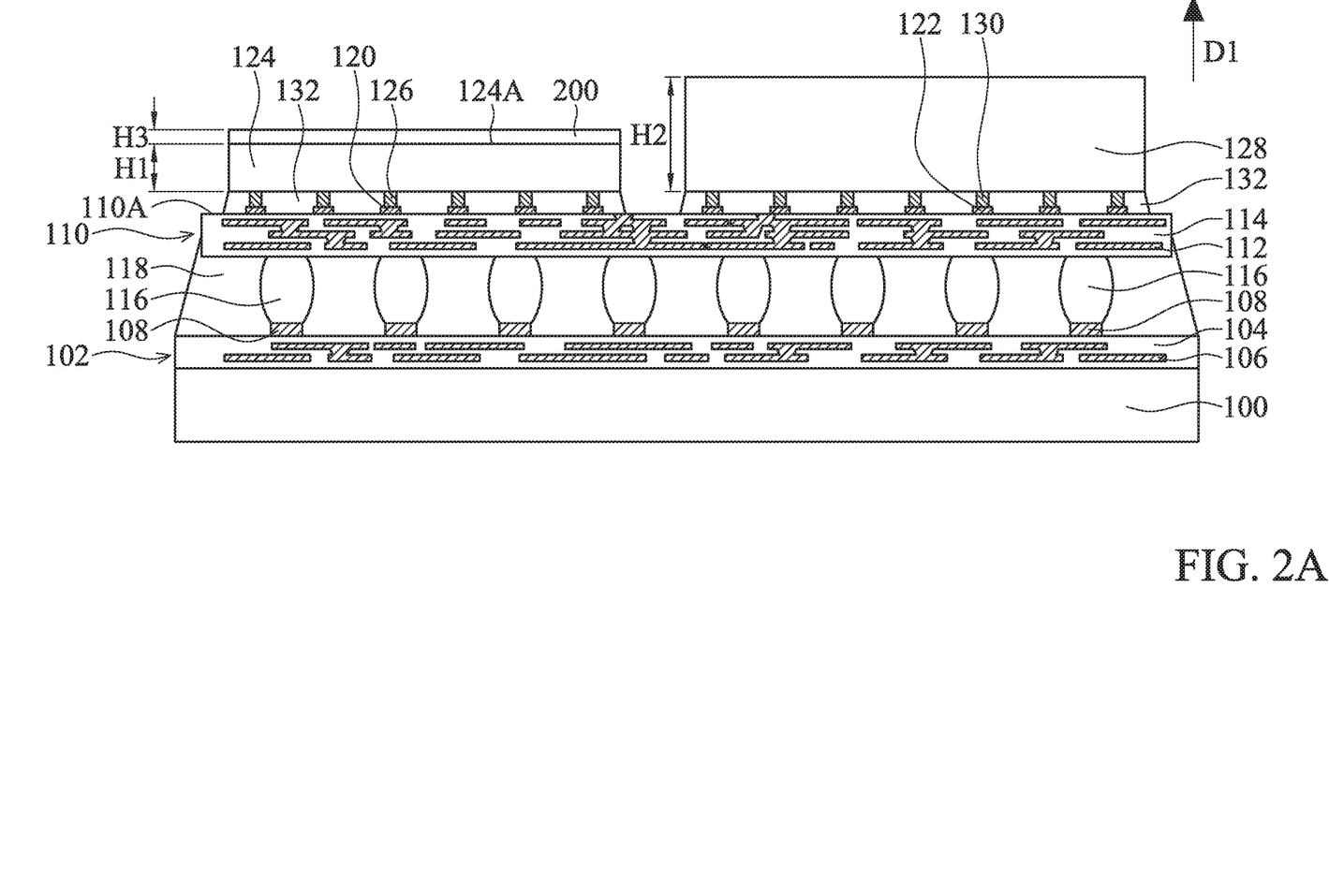
FIGS. 2A-2C are cross-sectional views of various stages of a process for forming a package structure, in accordance with some embodiments.
Figure 2B:
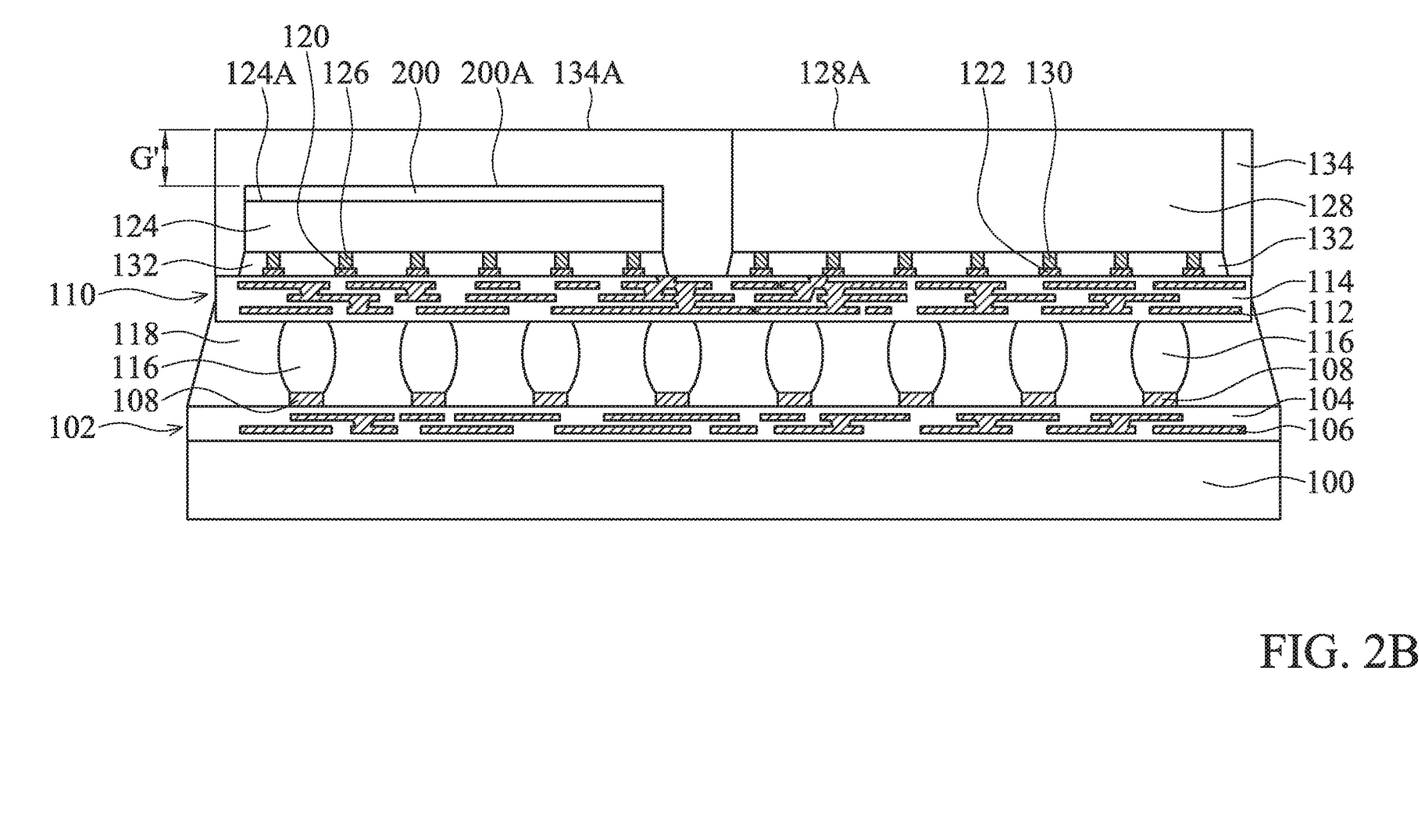
Figure 2C:
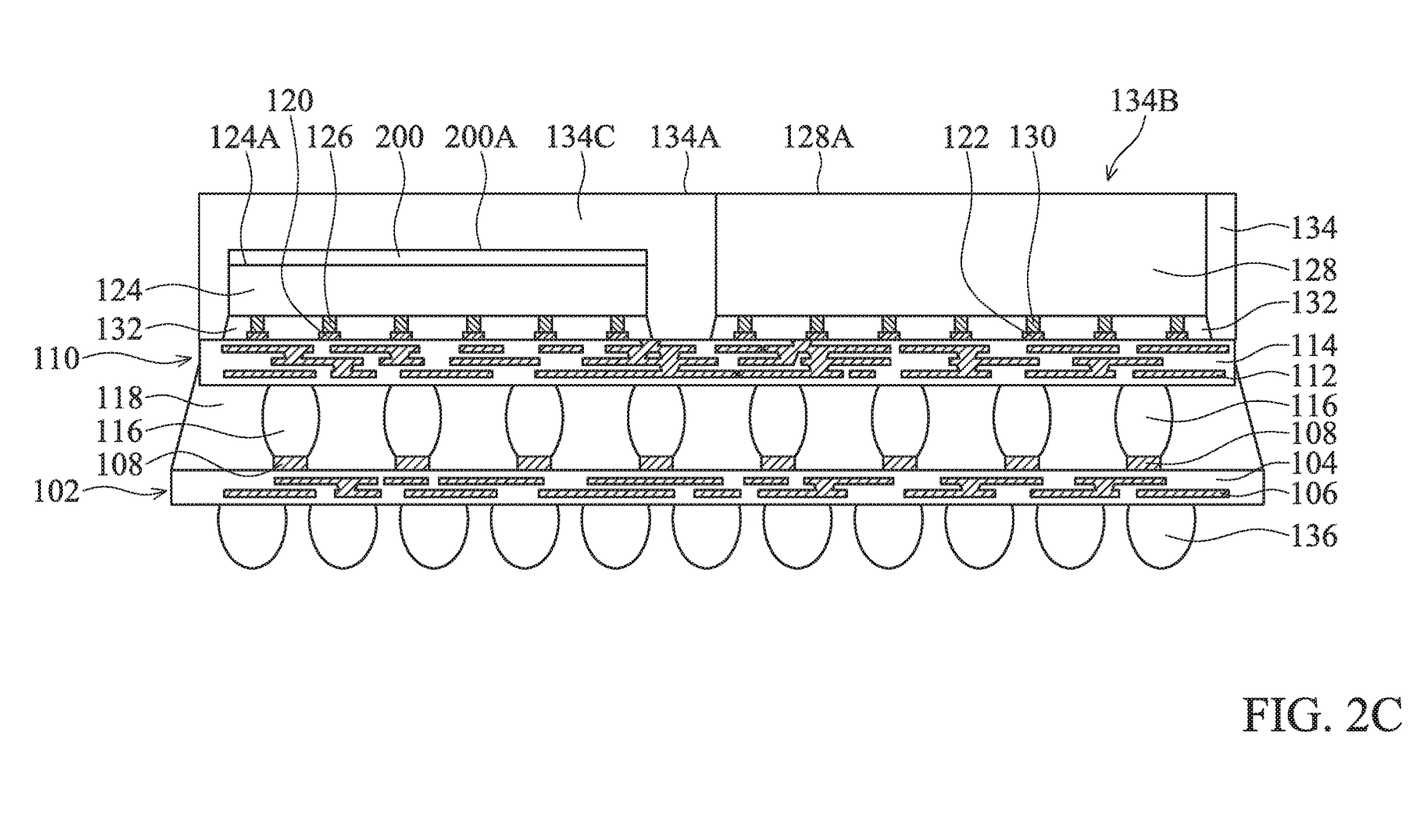

Many variations and/or modifications can be made to embodiments of the disclosure. FIGS. 2A-2C are cross-sectional views of various stages of a process for forming a package structure, in accordance with some embodiments.

As shown in FIG. 2A, a structure similar to that shown in FIG. 1C is provided or received. Afterwards, a cover film 200 is formed over each of the semiconductor devices 124, in accordance with some embodiments. In some embodiments, the cover film 200 is disposed directly on (i.e., in direct contact with) the top surface 124A of the semiconductor device 124. In some embodiments, the cover film 200 covers substantially the entire top surface 124A of the semiconductor device 124. In some embodiments, a sum (i.e., H1+H3) of the height H1 of the semiconductor device 124 and the height H3 of the cover film 200 in a direction D1 substantially perpendicular to the upper surface 110A of the interposer substrate 110 is smaller than the height H2 of the semiconductor device 128 in the direction D1, as shown in FIG. 2A.

In some embodiments, the cover film 200 includes an organic polymer material (e.g., epoxy, a resin, and the like) either with or without hardeners, fillers (e.g., silica filler, glass filler, aluminum oxide, silicon oxide, and the like), adhesion promoters, a combination thereof, or the like. Alternatively, the cover film 200 includes copper, aluminum, gold, titanium, another suitable metallic material, alloys thereof, or a combination thereof. The cover film 200 may be formed using a placement process, a printing process, a physical vapor deposition (PVD) process, a chemical vapor deposition (CVD) process, one or more other applicable processes, or a combination thereof.

As shown in FIG. 2B, a protective layer 134 is formed to surround and protect the semiconductor devices 124, cover film 200 and the semiconductor devices 128, in accordance with some embodiments. The materials and formation method of the protective layer 134 may be the same or similar to those of the protective layer 134 illustrated in FIG. 1D. In some embodiments, the cover film 200 includes a different material from the protective layer 134. For example, the protective layer 134 includes a molding material described above, and the cover film 200 includes an organic polymer material or a metallic material described above. In some embodiments, the hardness of the cover film 200 is greater than that of the protective layer 134.

In some embodiments, a planarization process is applied on the protective layer 134 to partially remove the protective layer 134. As a result, the top surface 128A of each semiconductor device 128 is exposed while the top surface 200A of each cover film 200 over the respective semiconductor device 124 is not exposed, as shown in FIG. 2B. In some embodiments, after the planarization process, the top surface 128A of each semiconductor device 128 is substantially flush with the top surface 134A of the protective layer 134, and the top surface 200A of each cover film 200 is separated from the top surface 134A of the protective layer 134 by a distance G'. The planarization process may include a grinding process, a chemical mechanical polishing (CMP) process, an etching process, a dry polishing process, one or more other applicable processes, or a combination thereof.

Afterwards, the carrier substrate 100 is removed to expose a surface of the package substrate 102, as shown in FIG. 2C in accordance with some embodiments. In some embodiments, conductive bumps 136 are then formed over the surface of the package substrate 102 that is originally covered by the carrier substrate, as shown in FIG. 1E. The materials and formation method of the conductive bumps 136 may be the same or similar to those of the conductive bumps 136 illustrated in FIG. 1E.

In some embodiments, a singulation process is then carried out. As a result, multiple separate package structures are formed. In FIG. 2C, one of the package structures is shown. Similar to the package structure shown in FIG. 1E, the protective layer 134 has an opening 134B that exposes the top surface 128A of each semiconductor device 128. This facilitates rapid heat dissipation from the semiconductor device 128 and avoids overheating.

Additionally, the protective layer 134 further has a cover portion 134C covering the top surface 200A of each cover film 200 so that the cover film 200 is interposed between the cover portion 134C and the top surface 124A of the respective semiconductor device 124, as shown in FIG. 2C. Being covered and pressed by both the cover portion 134C and cover film 200, the warpage in the semiconductor device 124 can be reduced. The stiffness of the cover film 200 also resists bending of the semiconductor device 124.

As a result, the performance and the reliability of the semiconductor devices in the package structure are improved. Consequently, the overall performance (including the electrical and mechanical performance) and the reliability of the package structure are also improved.

Figure 3:
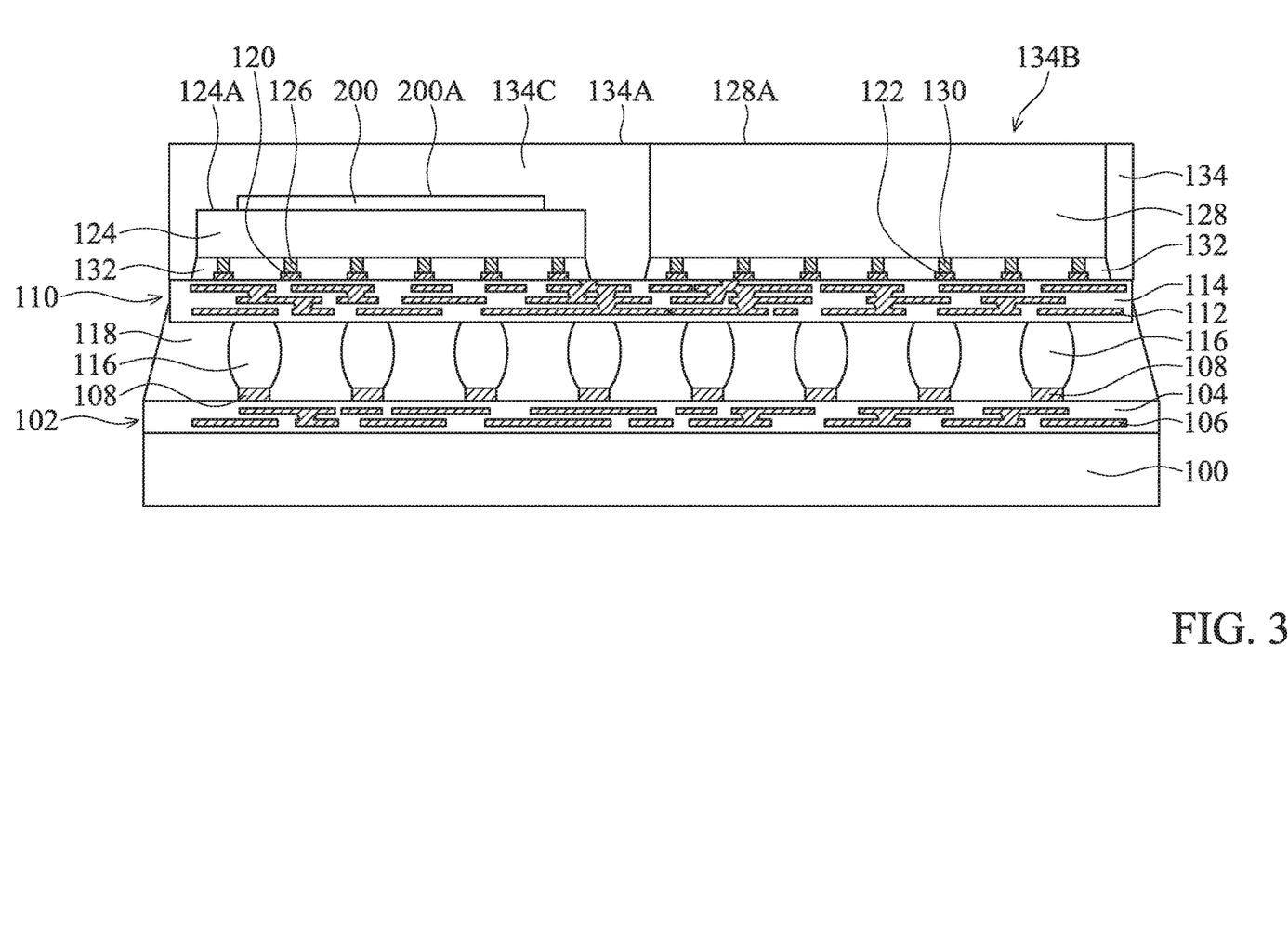
FIG. 3 is a cross-sectional view of a package structure, in accordance with some embodiments.

Many variations and/or modifications can be made to embodiments of the disclosure. FIG. 3 is a cross-sectional view of a package structure, in accordance with some embodiments. In FIG. 3, the cover film 200 is formed to cover a part of the top surface 124A of the semiconductor device 124 instead of the entire top surface 124A, while the other parts of the package structure are the same as those of the package structure shown in FIG. 2C. In some embodiments, the cover film 200 may cover about 90% to about 95% of the top surface 124A of the semiconductor device 124. It has been observed that providing this ratio of coverage over the semiconductor device 124 can effectively reduce warping that occurs in the semiconductor device 124. However, embodiments of the disclosure are not limited thereto. Other coverage of the cover film 200 over the semiconductor device 124 can also be used, as long as the warpage in the semiconductor device 124 can be reduced.

Figure 4:
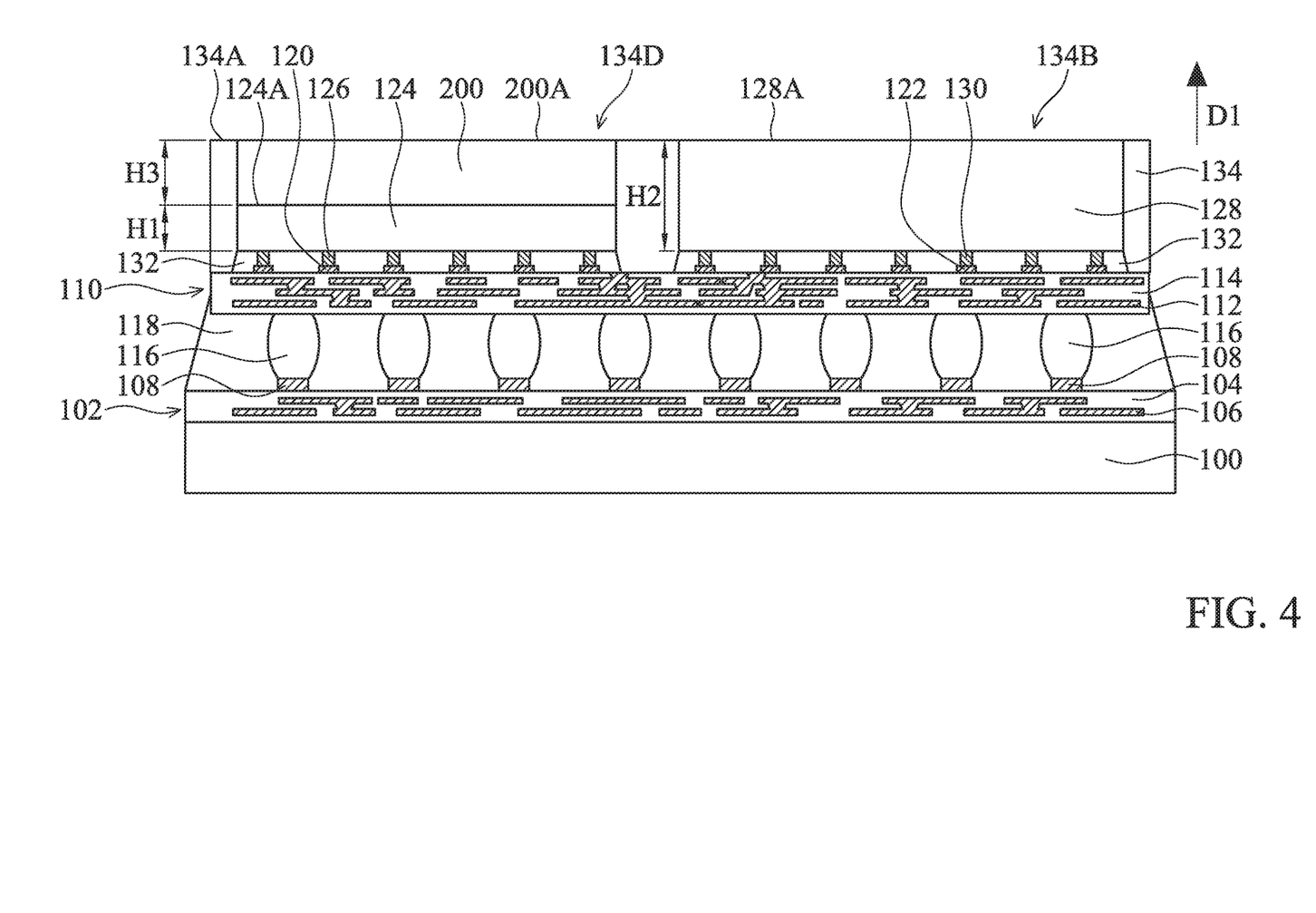
FIG. 4 is a cross-sectional view of a package structure, in accordance with some embodiments.

Many variations and/or modifications can be made to embodiments of the disclosure. FIG. 4 is a cross-sectional view of a package structure, in accordance with some embodiments. In FIG. 4, the protective layer 134 has not only an opening 134B that exposes the top surface 128A of each semiconductor device 128 but also an opening 134D that exposes the top surface 200A of each cover film 200 over the respective semiconductor device 124, while the other parts of the package structure are the same as those of the package structure shown in FIG. 2C.

In some embodiments, the cover film 200 is selected so that a sum (i.e., H1+H3) of the height H1 of the semiconductor device 124 and the height H3 of the cover film 200 in a direction D1 substantially perpendicular to the upper surface 110A of the interposer substrate 110 is equal to the height H2 of the semiconductor device 128 in the direction D1, as shown in FIG. 4. As such, after a planarization process is applied on the protective layer 134 to partially remove the protective layer 134, the top surface 134A of the protective layer 134 is substantially flush with the top surface 200A of the cover film 200 and the top surface 128A of the semiconductor device 128. This facilitates rapid heat dissipation from the semiconductor device 128 and semiconductor device 124 via the opening 134B and opening 134D and avoids overheating. In some embodiments where the cover film 200 includes a metallic material, it further helps to remove heat from the semiconductor device 124.

Although FIG. 4 shows that the cover film 200 covers the entire top surface 124A of the semiconductor device 124, the cover film 200 may also cover a part of the top surface 124A of the semiconductor device 124 in other unillustrated embodiments. Similar to the embodiments of FIGS. 2C and 3, the stiffness of the cover film 200 also resists warpage or bending of the semiconductor device 124.

Many variations and/or modifications can be made to embodiments of the disclosure. For example, the semiconductor devices 124 and/or semiconductor devices 128 in the package structures shown in FIGS. 1-4 may also be or include one or more package modules (as shown in FIG. 5, for example).

Figure 5:
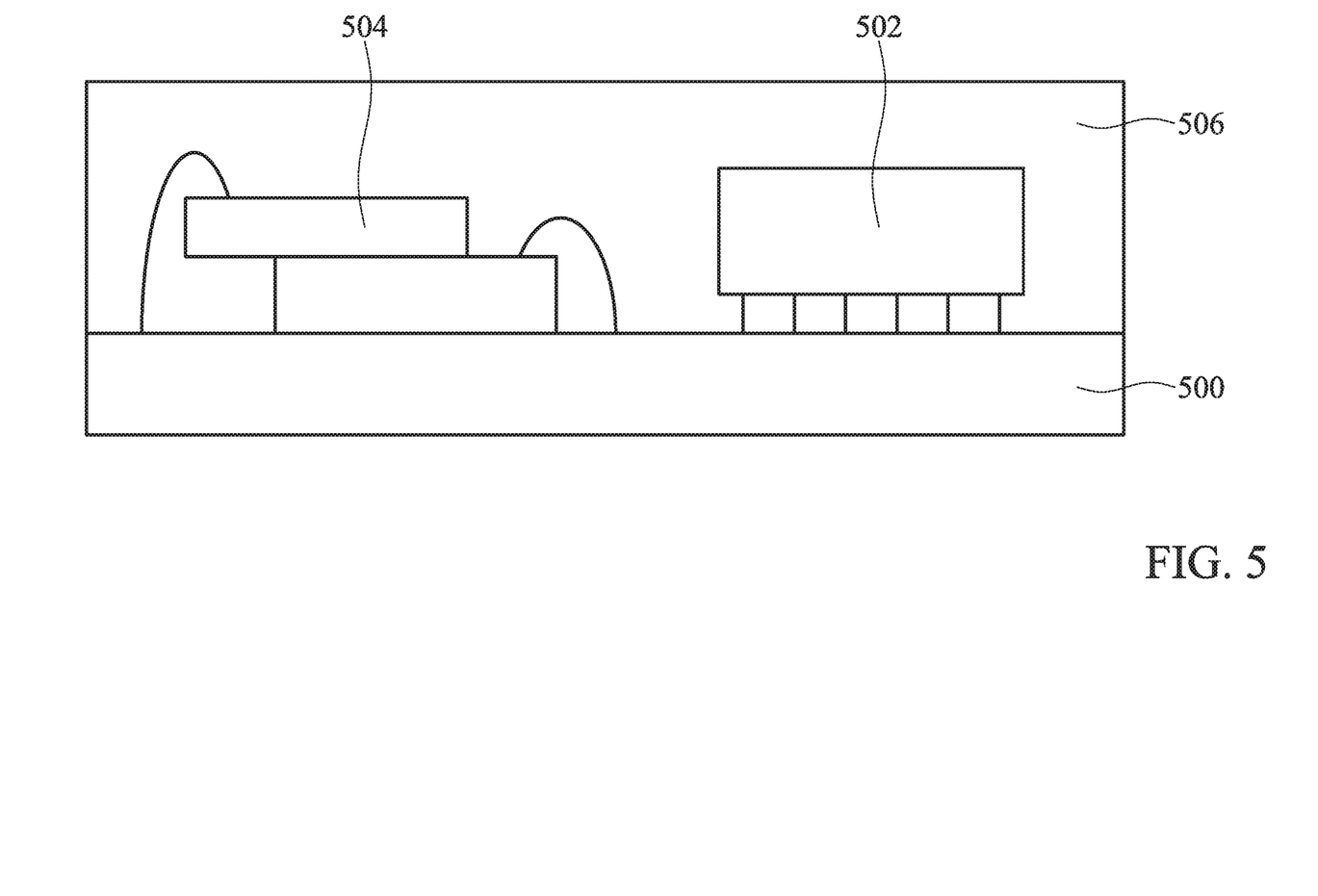
FIG. 5 is a cross-sectional view of a package module, in accordance with some embodiments.

As shown in FIG. 5, a package module includes an interconnection structure 500 and one or more semiconductor dies 502, 504 formed on the interconnection structure 500, in accordance with some embodiments. In various embodiments the semiconductor dies 502, 504 could be any type of semiconductor die described above. The semiconductor dies 502, 504 may be bonded to the interconnection structure 500 through flip-chip bonding, wire bonding, and/or any other applicable bonding methods. In some embodiments, the interconnection structure 500 is an interposer substrate that carries the semiconductor dies 502, 504 and provides electrical connection between the semiconductor dies 502, 504 and the interposer substrate 110 (see FIGS. 1-4). In these cases, the interconnection structure 500 has a structure that is similar to that of the interposer substrate 110. As shown in FIG. 5, a package module further includes a protective layer 506 formed over the interposer substrate 110 to surround and protect the semiconductor dies 502, 504, in accordance with some embodiments. The materials and formation method of the protective layer 506 may be the same or similar to those of the protective layer 134 illustrated in FIG. 1D.

Although there are only two types of semiconductor devices in the package structures of the above embodiments, more types of semiconductor devices can also be used in other embodiments.

Embodiments of the disclosure form a package structure including a package substrate, an interposer substrate over the package substrate, and multiple semiconductor devices over the interposer substrate. A protective layer is formed to surround and protect the semiconductor devices. Some semiconductor devices are exposed through openings in the protective layer, so that the heat generated can be quickly dissipated. Some other semiconductor devices are embedded in the protective layer and/or covered by additional cover films, so that warpage in the semiconductor devices can be reduced. The performance and the reliability of the semiconductor devices in the package structure are improved. Therefore, the overall performance (including the electrical and mechanical performance) and the reliability of the package structure are also improved.

In accordance with some embodiments, a package structure is provided. The package structure includes a package substrate, an interposer substrate, a first semiconductor device, a second semiconductor device, and a protective layer. The interposer substrate is disposed over the package substrate. The first semiconductor device and the second semiconductor device are disposed over the interposer substrate, wherein the first semiconductor device and the second semiconductor device are different types of electronic devices. The protective layer is formed over the interposer substrate to surround the first semiconductor device and the second semiconductor device. The second semiconductor device is exposed from the protective layer and the first semiconductor device is not exposed from the protective layer.

In accordance with some embodiments, a package structure is provided. The package structure includes a package substrate, an interposer substrate, a first semiconductor device, a second semiconductor device, a cover film, and a protective layer. The interposer substrate is disposed over the package substrate. The first semiconductor device and the second semiconductor device are disposed over the interposer substrate. The cover film is formed on the top surface of the first semiconductor device. The protective layer is formed over the interposer substrate to surround the first semiconductor device, the cover film and the second semiconductor device. The second semiconductor device is exposed from the protective layer and the first semiconductor device is not exposed from the protective layer.

In accordance with some embodiments, a method for forming a package structure is provided. The method includes stacking an interposer substrate disposed over the package substrate. The method also includes disposing a first semiconductor device and a second semiconductor device over the interposer substrate. The method further includes forming a protective layer over the interposer substrate to surround the first semiconductor device and the second semiconductor device. In addition, the method includes removing a part of the protective layer, so that the second semiconductor device is exposed from the protective layer and the first semiconductor device is not exposed from the protective layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a package substrate;
an interposer substrate disposed over the package substrate;
a first semiconductor device and a second semiconductor device disposed over the interposer substrate, wherein the first semiconductor device and the second semiconductor device are different types of electronic devices;
a cover film covering a top surface of the first semiconductor device; and
a protective layer formed over the interposer substrate to surround the first semiconductor device and the second semiconductor device, wherein the second semiconductor device is exposed from the protective layer and the first semiconductor device is not exposed from the protective layer, wherein the protective layer has a cover portion that covers a top surface of the cover film above the first semiconductor device, and the cover film has a greater hardness than that of the cover portion.

2. The package structure as claimed in claim 1, wherein the cover film comprises a different material from the protective layer.

3. The package structure as claimed in claim 1, wherein the cover film is disposed directly on the top surface of the first semiconductor device.

4. The package structure as claimed in claim 1, wherein the cover film covers a part of the top surface of the first semiconductor device.

5. The package structure as claimed in claim 1, wherein the cover film covers the entire top surface of the first semiconductor device.

6. The package structure as claimed in claim 1, wherein the top surface of the cover film is in direct contact with the cover portion.

7. A package structure, comprising:
a package substrate;
an interposer substrate disposed over the package substrate;
a first semiconductor device and a second semiconductor device disposed over the interposer substrate;
a cover film formed on and in direct contact with a top surface of the first semiconductor device; and
a protective layer formed over the interposer substrate to surround the first semiconductor device, the cover film and the second semiconductor device, wherein the second semiconductor device is exposed from the protective layer and the first semiconductor device is not exposed from the protective layer, wherein the protective layer has a cover portion that covers a top surface of the cover film, and the cover film has a greater hardness than that of the cover portion.

8. The package structure as claimed in claim 7, wherein a top surface of the protective layer is flush with a top surface of the second semiconductor device.

9. The package structure as claimed in claim 7, wherein the cover film covers a part of the top surface of the first semiconductor device.

10. The package structure as claimed in claim 7, wherein the cover film covers the entire top surface of the first semiconductor device.

11. The package structure as claimed in claim 7, wherein the cover film comprises a different material from the protective layer.

12. The package structure as claimed in claim 7, wherein the cover portion covers the entire top surface of the cover film.

13. The package structure as claimed in claim 7, wherein the top surface of the cover film is closer to a top surface of the protective layer than the top surface of the first semiconductor device.

14. A package structure, comprising:
a package substrate;
an interposer substrate disposed over the package substrate;
a first semiconductor device and a second semiconductor device disposed over a surface of the interposer substrate;
a cover film formed on a top surface of the first semiconductor device; and
a protective layer formed over the interposer substrate to surround the first semiconductor device, the cover film and the second semiconductor device, wherein a top surface of the second semiconductor device is exposed through the protective layer, wherein the protective layer has a cover portion formed on a top surface of the cover film so that the top surface of the cover film is vertically spaced from a top surface of the protective layer, and the cover film has a greater hardness than that of the cover portion.

15. The package structure as claimed in claim 14, wherein a sum of a height of the first semiconductor device and a height of the cover film in a direction perpendicular to the surface of the interposer substrate is smaller than a height of the second semiconductor device in the direction.

16. The package structure as claimed in claim 14, wherein the cover film covers and in direct contact with the top surface of the first semiconductor device.

17. The package structure as claimed in claim 14, wherein the cover film comprises a different material from the protective layer.

18. The package structure as claimed in claim 14, wherein the cover film covers a part of the top surface of the first semiconductor device.

19. The package structure as claimed in claim 18, wherein the cover portion is in direct contact with another part of the top surface of the first semiconductor device that is not covered by the cover film.

20. The package structure as claimed in claim 14, wherein the cover film comprises a metallic material.

\* \* \* \* \*